United States Patent [19]
Gordon

[11] Patent Number: 4,861,402
[45] Date of Patent: Aug. 29, 1989

[54] METHOD OF MAKING A CELLULOSE ACETATE BUTYRATE PELLICLE

[75] Inventor: Joseph Gordon, Wappingers Falls, N.Y.

[73] Assignee: Du Pont Tau Laboratories, Inc., Wilmington, Del.

[21] Appl. No.: 238,413

[22] Filed: Aug. 31, 1988

Related U.S. Application Data

[60] Division of Ser. No. 94,026, Sep. 4, 1987, Pat. No. 4,796,973, which is a continuation of Ser. No. 661,577, Oct. 16, 1984, abandoned.

[51] Int. Cl.$^4$ ............................................. B29C 41/04
[52] U.S. Cl. ................................ 156/108; 156/160; 156/246; 264/1.7; 264/2.1; 264/311
[58] Field of Search .................... 264/1.7, 2.1, 311; 156/108, 160, 246

[56] References Cited

U.S. PATENT DOCUMENTS 2,570,273 10/1951 Pryor .................................. 156/108
4,378,953 4/1983 Winn ................................... 350/1.1

Primary Examiner—James Lowe
Attorney, Agent, or Firm—Ostrolenk, Faber, Gerb & Soffen

[57] ABSTRACT

A freely standing thin pellicle film of cellulose acetate buterate is formed by spinning on a rotating substrate. After forming, the film is lifted off of the substrate and secured to a metallic frame. The pellicle is for use in the mid ultraviolet range of 280 to 360 nanometers, but can be used also in the deep ultraviolet range, e.g. wavelengths as low as about 240 nanometers. The pellicle prevents dust particles from being focused on a surface which is to be exposed by the ultraviolet radiation.

8 Claims, 2 Drawing Sheets

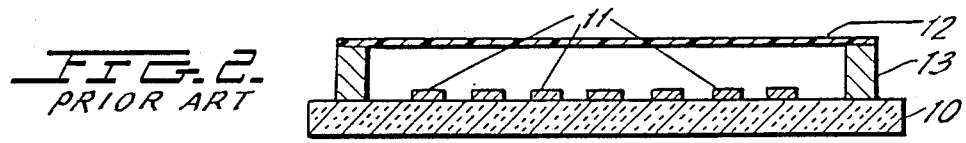
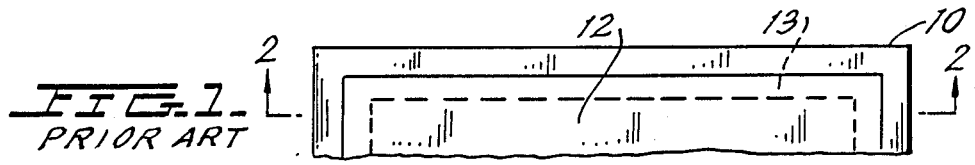
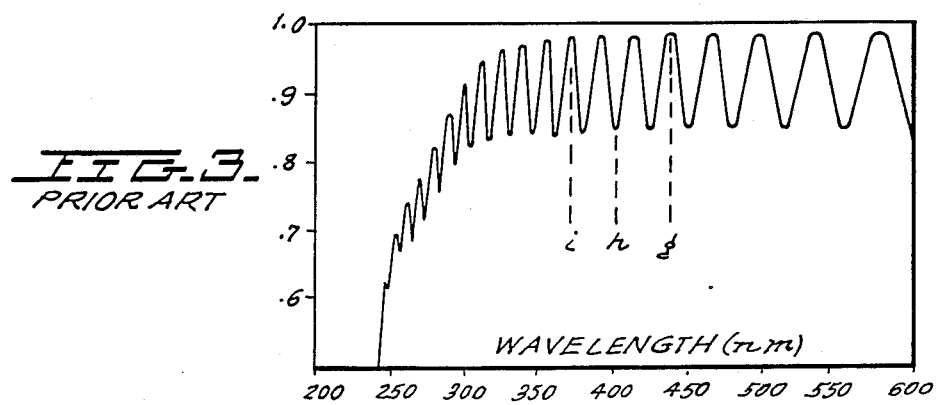
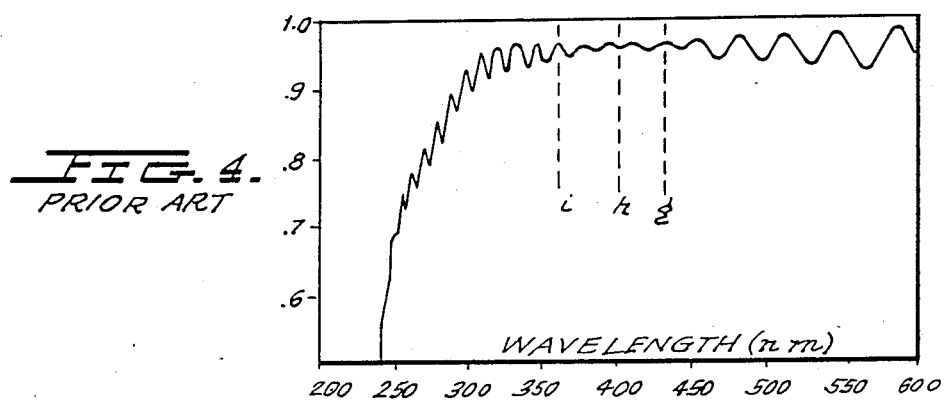
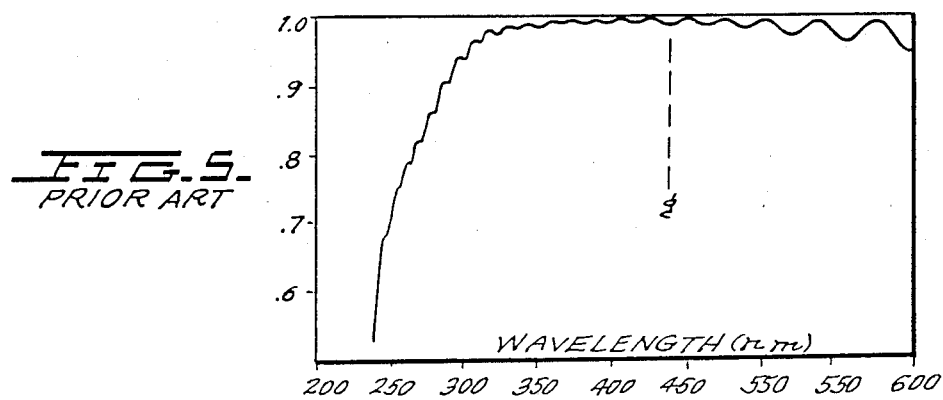

METHOD OF MAKING A CELLULOSE ACETATE BUTYRATE PELLICLE

This is a division of application Ser. No. 094,026, filed Sept. 4, 1987, now Pat. No. 4,796,973, which was a continuation of application Ser. No. 661,577, filed Oct. 16, 1984 and now abandoned.

BACKGROUND OF THE INVENTION

This invention relates to a pellicle structure used for the protection of photo masks and reticles in microlithography applications and, more specifically, relates to a novel pellicle structure which can transmit an average of about 90% or greater over a radiation band width beginning at about 240 nanometers.

Pellicles, which are free standing thin transparent organic films are commonly used to protect photo masks and reticles in order to increase die yield in microlithography during the manufacture of semiconductor devices. Such pellicles are normally attached to a mask used in the microlithography application and stand above the mask suface by a given distance. Thus, dust particles which may settle during the microlithography operation will settle on the pellicle and be defocused on the work surface. Consequently, when used in a conventional photolithographic apparatus, one or more dust particles will not affect the yield of a given wafer. Die yield from such wafers is improved by up to and greater than 40% when the mask and/or reticle are pellicle protected.

Pellicles of this type are described in a publication by R. Hershel, Semiconductor International, 8, 97, (1981). Their use is also described in a publication by A. Rangappan, C. Kao, "SPIE Optical Microlithography", Vol. 334, 52, (1982). Also, see I. Ward, Dawn Duly, SPIE, Vol. 470, Optical Microlithography III: Technology for the Next Decade (1984), pp. 147–156.

A standard pellicle being sold today, for example by the assignee of the present application, consists of a membrane which is commonly of nitrocellulose having a thickness of about 2.85 microns. Such nitrocellulose pellicles satisfy the light transmission requirements for most present microlithography applications. Films other than nitrocellulose are also known for use as pellicles. By way of example, films have been made of materials such as mylar, cellulose acetate, and parylene (poly(chloro-p-xycylene)). Other materials are also known and the foregoing is not an exhaustive list. Nitrocellular pellicles do not transmit sufficient light at shorter wavelengths, for example below 360 nanometers. However, there is a growing need for pellicle materials which can transmit useful amounts of an input light in the mid range of ultraviolet wavelengths, particularly in the 280 to 360 nanometer range. Such materials must also permit relatively economical manufacture and have mechanical durability which will enable them to exist as a free standing membrances which are not too rapidly degraded by ultraviolet radiation and can withstand at least minimal mechanical abuse during handling and cleaning. Moreover, the pellicle film must be capable of being made thin enough and of sufficient uniformity so as to not interfere with the optical properties of the microlithographic process.

BRIEF SUMMARY OF THE INVENTION

In accordance with the present invention, pellicle membranes of cellulose acetate butyrate in a range of formulations have been found to satisfy the ultraviolet transmissions and durability properties required of free standing membranes at ultraviolet frequencies in the deep and mid ultraviolet ranges of 240 to 290 nanometers and 290 to 360 nanometers, respectively. More particularly, the novel membrane of the invention is useful at frequencies beginning at about 240 nanometers, particularly when antireflection coatings are used. Indeed, the use of an antireflection coating on both surfaces of the cellulose acetate butyrate membrane of the invention permits transmission at frequencies as low as the cut-off transmission frequency of silica mask substrates which is approximately 190 nanometers.

A preferred cellulose acetate butyrate composition employs about 15% butyrul, and a 15 sec viscosity. The butyryl content can vary from 5% to 40%. Its viscosity can vary from 5 sec to 20 sec. This material is available from Eastman Kodak under their catalog number 4623, CAS Registry No. 9004-36-8. This material is offered for sale by Eastman Kodak for use as a hot melt or as a strippable coating used for high-gloss coatings and protective coatings, respectively. Eastman Kodak cellulose acetal butyrate coatings are described in their bulletins No. 3.4A, E-101B, and E184A, each of which is dated July, 1973. Note that these coatings are not suggested by Eastman Kodak to be capable of free standing use as a transparent film but are always intended to be fixed in surface to surface contact with a substrate such as a wooden surface which is to have a desired finish appearance or a metallic surface which is to be protected by the film which ordinarily adheres to its surface.

It was found that this material can be dissolved in a suitable solvent, preferably cyclohexanone, to a workable viscosity which enables the material to be filtered and then spin-coated on a glass substrate. For example, from 3% to 10% of the cellulose acetate butyrate, by weight, solids content, can be dissolved in cyclohexanone. The substrate can be rotated at any appropriate speed selected from about 300 rpm to about 2,000 rpm and is spun for a time depending on the desired thickness to be obtained. This time will also depend upon atmospheric conditions and solvent concentration in the spinning apparatus. It was found that the spin coating process inherently forms an acceptably thin coating and by suitable adjustment of speeds and other parameters a thickness of 2.85 microns can be obtained in a repeatable manner within suitable tolerances by spinning at from 400 to 600 rpm, nominally, at 500 rpm. Film thicknesses from 1 micron to 5 microns can be made by appropriate adjustment of the process.

Thereafter, the substrate and film thereon is loaded into a water bath and the film is loosened from the glass substrate and secured to the end of a metal frame as by cementing with an epoxy type cement or the like.

The film may also be coated on one or both surfaces with an antireflection coating of known composition, for example calcium fluoride. The index of refraction of the cellulose acetate butyrate is approximately that of nitrocellulose so tha the low reflectivity coating will be almost as effective on membranes of either material.

The novel pellicle film of the invention and having a thickness, for example of 2.85 microns has the novel characteristic in the mid ultraviolet range which extends between 280 nanometers and 360 nanometers that it transmits an average of about greater than 90% of incident light without the use of antireflection coatings. Moreover, there is substantial light transmission into the deep ultraviolet range which is less than about 280 nanometers. When the surfaces of the pellicle of the invention are provided with one or more antireflection coatings, transmission in the deep ultraviolet range is further improved such that an average greater than 90% transmission is obtained at frequencies above about 240 nanometers. When coated with one or more antireflection coatings, this film will transmit greater than about 90% of incident light in the band of 240 nanometers to 600 nanometers.

The pellicle was also found to have improved mechanical durability, better resistance to chemicals used to clean pellicles, and is not deteriorated adversely by mid ultraviolet radiation.

BRIEF DESCRIPTION OF THE DRAWINGS

FIG. 1 is a top view of a portion of a silica mask which has a conductive coating thereon and a pellicle secured thereto.

FIG. 2 is a cross-sectional view of FIG. 1 taken across the section line 2—2 in FIG. 1.

FIG. 3 shows the spectral transmission for a prior art nitrocellulose pellicle having a thickness of 2.85 microns.

FIG. 4 shows the spectral transmission characteristic for the nitrocellulose pellicle of FIG. 3 when it is coated with an antireflection coating on one side of the pellicle film.

FIG. 5 shows a prior art pellicle of the type shown in FIG. 3 with antireflection coatings on both surfaces of the pellicle film.

DETAILED DESCRIPTION OF THE INVENTION

Figure 6:
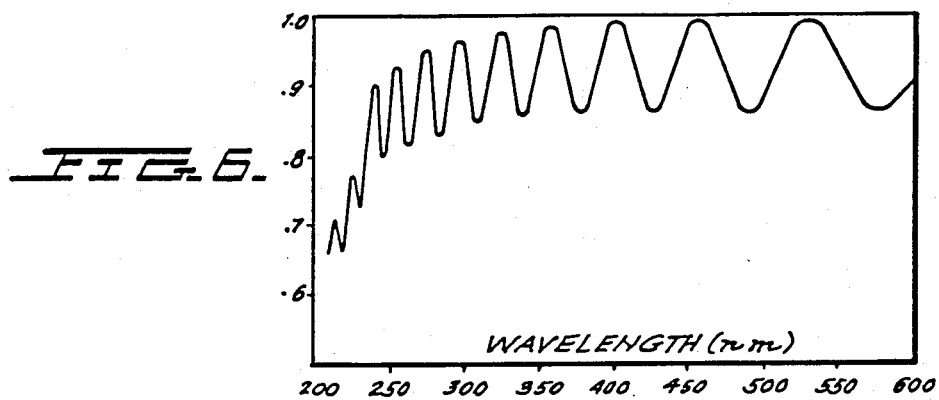
FIG. 6 shows the spectral transmission of a pellicle film of cellulose acetate butyrate made in accordance with the invention and demonstrates its improved transmission in the deeper ultraviolet regions.

FIGS. 1 and 2 illustrate a conventional pellicleized mask wherein a silica mask 10 is a standard mask having a metallized pattern 11 on its upper surface (FIG. 2). The pellicle shown in FIGS. 1 and 2 consists of a thin organic film 12 which is fastened to a rectangular metal frame 13 which will have a shape dependent upon the manner in which the mask is to be mounted in the projection aligner or step and repeat aligner used for the microlithography process. The film area can be any area desired or necessary in the microlithography application and will match the shape of the underlying mask.

Film 12 has been made of numerous materials in the past, notably nitrocellulose having a thickness of 2.85 microns. Other thicknesses have also been used, for example 0.865 microns. A commercially available pellicle manufactured by the assignee of the present application is a nitrocellulose film pellicle known as "Type 1" having a thickness of 2.85 microns and a spectral transmission characteristic which is shown in FIG. 3.

In FIG. 3, the horizontal axis of the graph is wavelength in nanometers of a standard high pressure mercury lamp while the vertical axis shows the percentage transmission of light through the pellicle. Conventionally, the pellicle of FIG. 3 is preferably operated at the i, h and g wavelengths which are shown in dotted lines in the band between 350 and 450 nanometers. Note particularly that the pellicle having the characteristic of FIG. 3 cannot be used in relatively deep ultraviolet application since the transmission of light is sharply reduced below about 360 nanometers.

Nitrocellulose films having the characteristic of FIG. 3 can be made by numerous processes, preferably a spinning process employing the well-known technology used in spinning photoresists onto a substrate. The films are then conventionally lifted off in a water bath and cemented to frames such as the frame 13 of FIGS. 1 and 2 so that they are stretched tautly on the frame.

In order to improve its spectral transmission characteristics, it is known to apply an antireflection coating on one surface of the pellicle. This improves the characteristic to that shown in FIG. 4 for the nitrocellulose film of 2.85 microns.

A still further improvement in the light tranmission of the pellicle can be obtained by using an antireflective coating on both sides of the pellicle film as shown in FIG. 5. These antireflection coatings can be any desired type, for example calcium fluoride coatings which are applied by conventional known processes.

In accordance with the present invention, the film 12 of FIGS. 1 and 2 is made of a cellulose acetate butyrate. In a preferred embodiment of the invention, the cellulose acetate butyrate contained about 15% butyryl and had a 15 sec viscosity. The material is commercially available from Eastman Kodak; catalog material No. 4623, CAS Registry No. 9004-36-8. The viscosity can vary in the range of from 5 sec to 20 sec and the butyryl content can vary between 5% and 40%. Three percent to 10% solids by weight, preferably 6% of this material was dissolved in cyclohexanone to a workable viscosity and was then filtered and thereafter spin coated on a glass substrate. Other solvents can be used, for example, organic acetates, ketones, ethylene and propylene chlorides. These will produce good films, but cyclohexanone lent itself to good filtering.

The spinning process is essentially identical to conventional spin processes used for spinning photoresists onto a substrate. Thus, in solutions with 3% to 10% solids, spin rates of 300 to 2,000 rpm can be used to produce pellicles in a range of thicknesses from 1 micron to 5 microns. For a 2.85 micron thick pellicle, and using 6% solids by weight, the spin speed is from 400 to 600 rpm, nominally 500 rpm.

After forming the film, the substrate and film are placed in a water bath and the film is separated from the glass substrate. The film is then appropriately cemented to a support frame (support frame 13 of FIGS. 1 and 2) by a suitable epoxy cement and extends tautly across the frame.

Figure 7:
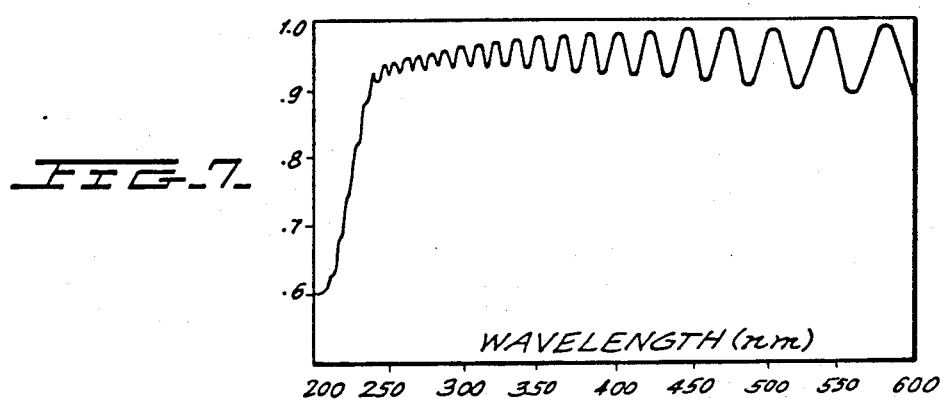
FIG. 7 illustrates the characteristics of the cellulose acetate butyrate pellicle film of FIG. 6 when one side is covered with an antireflection coating.
Figure 8:
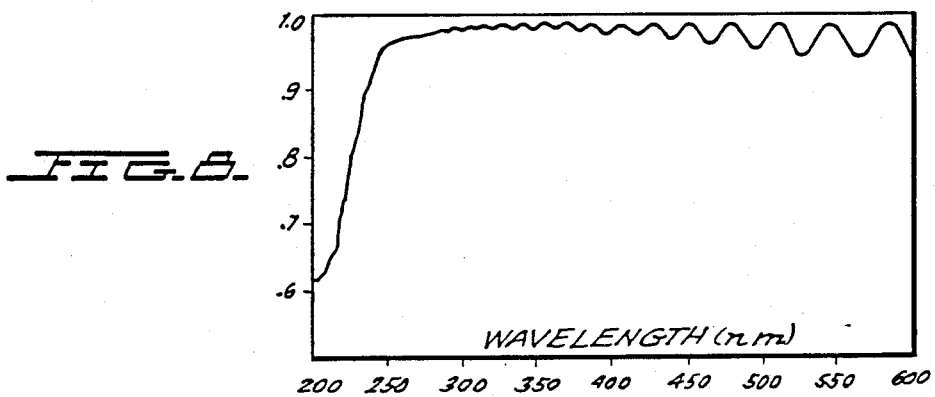
FIG. 8 shows the spectral transmission characteristic of the film of FIG. 6 when both sides are coated with an antireflection coating.

When the pellicle film had a thickness of 2.85 microns, the spectral transmission characteristics shown in FIG. 6 were obtained. When the film was coated on one surface or two surfaces respectively, the characteristics of FIGS. 7 and 8, respectively, were obtained.

In examining the spectral transmission characteristics of FIG. 6, it will be observed that the spectral transmission of the 2.85 micron cellulose acetate butyrate film at 240 nanometers is greater than about 0.72% and, at 250 nanometers, peaks at about 90%. These transmission characteristics are adequate for application in the deep ultraviolet region in photomicrolithography applications. The transmission is substantially improved by use of antireflection coating on one or both pellicle surfaces. Thus, in FIG. 7, it will be seen that the transmission at 240 nanometers is substantially greater than 80%, and in FIG. 8, approaches 90%.

Although the present invention has been described in connection with a preferred embodiment thereof, many variations and modifications will now become apparent to those skilled in the art. It is preferred, therefore, that the present invention be limited not by the specific disclosure herein, but only by the appended claims.

What is claimed is:

1. A process of making a pellicle comprising the steps of dissolving cellulose acetate butyrate in a solvent, filtering said dissolved cellulose acetate butyrate and solvent, spin coating said cellulose acetate butyrate and solvent on a spinning substrate and driving off said solvent to form a substantially uniformly thick film of cellulose acetate butyrate, lifting said film from said substrate and cementing said film to one end of a support frame with said film tautly stretched over said frame.

2. The process of claim 1, wherein said cellulose acetate butyrate contains from 5% to 40% butyryl, and has a viscosity of from 5 sec to 20 sec.

3. The process of claim 2, wherein said solvent is cyclohexanone.

4. The process of claim 1, wherein said cellulose acetate butyrate has about 15% butyryl and a viscosity of about 15 sec.

5. The process of claim 3, wherein said cellulose acetate butyrate has about 15% butyryl and a viscosity of about 15 sec.

6. The process of claim 1, wherein from 3% to 10% by weight of said cellulose acetate butyrate is dissolved in said solvent.

7. The process of claim 3, wherein from 3% to 10% by weight of said cellulose acetate butyrate is dissolved in said solvent.

8. The process of claim 6, wherein said spin rate is in the range of 300 to 2,000 rpm.

* * * * *